United States Patent [19]

Alini et al.

[11] Patent Number: 6,147,825
[45] Date of Patent: *Nov. 14, 2000

[54] TIMER WITH TEMPERATURE COMPENSATION OF TIME DELAYS

[75] Inventors: Roberto Alini, Stradella; Melchiorre Bruccoleri, Genoa; Gaetano Cosentino, Catania; Marco Demicheli, Binago, all of Italy

[73] Assignee: STMicroelectronics S.r.l., Agrate Brianza, Italy

[ * ] Notice: This patent is subject to a terminal disclaimer.

[21] Appl. No.: 09/152,866

[22] Filed: Sep. 14, 1998

Related U.S. Application Data

[63] Continuation of application No. 08/726,075, Oct. 3, 1996, Pat. No. 5,808,941.
[60] Provisional application No. 60/004,744, Oct. 3, 1995.

[51] Int. Cl.[7] .................................................. G11B 5/09
[52] U.S. Cl. ................................................... 360/51
[58] Field of Search ....................... 360/51; 368/113–120

[56] References Cited

U.S. PATENT DOCUMENTS

| | | | |
|---|---|---|---|
| 4,814,725 | 3/1989 | Vitiello | 331/1 A |
| 4,982,350 | 1/1991 | Perna et al. | 364/569 |
| 5,001,482 | 3/1991 | Chung et al. | 341/136 |
| 5,440,305 | 8/1995 | Signore et al. | 341/120 |

OTHER PUBLICATIONS

Mita et al., "TP 4.1: A 150Mb/s PRML Chip for Magnetic Disk Drives," in *Digest of Technical Papers*, IEEE International Solid–State Circuits Conference, Buena Vista, California, Feb. 8, 1996, pp. 62–63.

Tuttle et al., "TP 4.2: A 130Mb/s PRML Read/Write Channel with Digital–Servo Detection," in *Digest of Technical Papers*, IEEE International Solid–State Circuits Conference, Buena Vista, California, Feb. 8, 1996, pp. 64–65.

Parsi et al., "TP 4.3: A 200 Mb/s PRML Read/Write Channel IC," in *Digest of Technical Papers*, IEEE International Solid–State Circuits Conference, Buena Vista, California, Feb. 8, 1996, pp. 66–67.

Richetta et al., WP5.1: A 16MB/s PRML Read/Write Data Channel, in *Digest of Technical Papers*, IEEE International Solid–State Circuits Conference, Feb. 15, 1995, pp. 78–79.

Pearson et al., WP5.2: 250MHz Digital FIR Filters for PRML Disk Read Channels, in *Digest of Technical Papers*, IEEE International Solid–State Circuits Conference, Feb. 15, 1995, pp. 80–81.

Roo et al., "Analog Timing Recovery Architectures for PRML Detectors," *IEEE*, 1995, pp. 571–576.

Moore, Steve, "A High Performance Digital Read Channel for Hard Disk Drives Using PRML Techniques," IEEE 1993 Custom Integrated Circuits Conference, Scotts Valley, California, pp. 10.5.1–10.5.4.

Feucht, *Handbook of Analog Circuit Design*, Academic Press, Inc., San Diego, California, "Signal–Processing Circuits," Chapter 11, 1990, pp. 522, 526–534, and 566.

Vittoz, "The Design of High–Performance Analog Circuits on Digital CMOS Chips," *IEEE J. Solid–State Circuits* SC–20(3):657, 659–660, 662–3, Jun. 1985.

Michejda et al., "A Precision CMOS Bandgap Reference," *IEEE J. Solid–State Circuits* SC–19(6):1014, Dec. 1984.

(List continued on next page.)

*Primary Examiner*—W. Chris Kim
*Attorney, Agent, or Firm*—Theodore E. Galanthay; Michael J. Donohue; Seed IP Law Group PLLC

[57] ABSTRACT

A temperature-compensated high-speed timing circuit, which is particularly advantageous in read-interface circuits for disk-drive interface. The voltage on the integrating capacitor is compared against a voltage defined by the drop, on a resistor, induced by a current which is the combination of a reference current from a reference current generator with a temperature-dependent current from another current generator.

14 Claims, 5 Drawing Sheets

OTHER PUBLICATIONS

Song et al., "A Prescision Curvature–Compensated CMOS Bandgap Reference," *IEEE J. Solid–State Circuits SC–18*(6):634, Dec. 1983.

Coughlin et al., Operational Amplifier and Linear Intergrated Circuits, 2d ed., Prentice–Hall, Inc., Englewood Cliffs, N.J., 1982, pp. 51–73, 181–199.

Connelly, J. A., Analog Integrated Circuits, Devices, Circuits, Systems, and Applications, John Wiley & Sons, Inc. New York, 1975, pp. 33–51, 67–69.

Faber, R., Linear Circuits, Discrete and Integrated, Charles E. Merrill Publishing Co., Columbus, OH, 1974, pp. 5, 58, 131, 173, 247.

TIMER WITH TEMPERATURE COMPENSATION OF TIME DELAYS

CROSS-REFERENCE TO RELATED APPLICATION

This application is a continuation of U.S. patent application Ser. No. 08/726,075, filed Oct. 3, 1996, now U.S. Pat. No. 5,808,971.

This application claims priority from provisional application Ser. No. 60/004,744 filed Oct. 3, 1995, which is hereby incorporated by reference.

BACKGROUND AND SUMMARY OF THE INVENTION

The present invention relates to precision integrated analog timing circuits.

Analog timing circuits are often used to provide time durations which are too short to be measured by digital timing circuits. One particular area where such circuits are needed is in read-interface circuits which are used to interface to disk drives. (However, this is far from the only application of analog timers.)

In read-interface circuits, the data encoded in the magnetic medium appears electrically (after amplification and possibly some filtering) as a series of pulses. The raw signal includes various rising and falling voltage transitions, but the correct interpretation of this signal (in terms of data bits) requires that the voltage transitions be correctly identified with data bits. Thus reading requires correct phase information. Achieving this phase information requires an accurate timing function. However, the durations involved are too short (e.g. 3–10 nanoseconds) for a digital timing circuit. If the phase information is not correct, the bit error rate will be increased.

The need for an accurate timing function is particularly critical in "PRML" (partial-response-maximum-likelihood) disk-drive read-interface circuits. Such circuits offer significant advantages, but pose the drawback that clock recovery is generally more difficult than in peak detector circuits. See generally, e.g., the following titles, all of which are hereby incorporated by reference: Abidi, "Integrated circuits in magnetic disk drives," ESSCIRC '94 PROCEEDINGS 48 (1994); Roo et al., "Analog timing recovery architectures for PRML detectors," 1 GLOBECOM '95 RECORD 571 (1995); Moore, "A high performance digital read channel for hard disk drives using PRML techniques," CICC '93 Proceedings at pp.10.5.1–10.5.4 (1993); Parsi et al., "A 200 Mb/s PRML read/write channel IC," 1996 ISSCC DIGEST at 66-67 and 419; Tuttle et al., "A 130 Mb/s PRML read/write channel with digital-servo detection," 1996 ISSCC DIGEST at 64-5 and 419; Mita et al., "A 150 Mb/s PRML chip for magnetic disk drives," 1996 ISSCC DIGEST at 62-3 and 418; Pearsen et al., "250 MHz digital FIR filters for PRML disk read channels," 1995 ISSCC DIGEST at 80-1 and 342; Richetta et al., "A 16 MB/s PRML read/write data channel," 1995 ISSCC DIGEST at 78-9 and 342.

Thus precision analog timing circuits must be used. However, the environment of the read interface circuitry (especially in a portable computer) is not friendly: the read interface circuitry must tolerate an ambient temperature range of 0–70° C. Analog circuits are notoriously susceptible to temperature dependence. Temperature variation is particularly inconvenient for analog timing circuits, since such variation may cause the bit error rate to increase, and hence the read operation will be slowed or halted.

Innovative Timing Circuit

The present application discloses a temperature-compensated high-speed timing circuit, which is particularly advantageous in read-interface circuits for disk-drive interface. (However, this circuit can also be used in other analog timer applications.) In this circuit the voltage on the integrating capacitor is compared against a voltage defined by the drop, on a resistor, induced by a current which is the combination of a reference current from a reference current generator with a temperature-dependent current from another current generator.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 1:
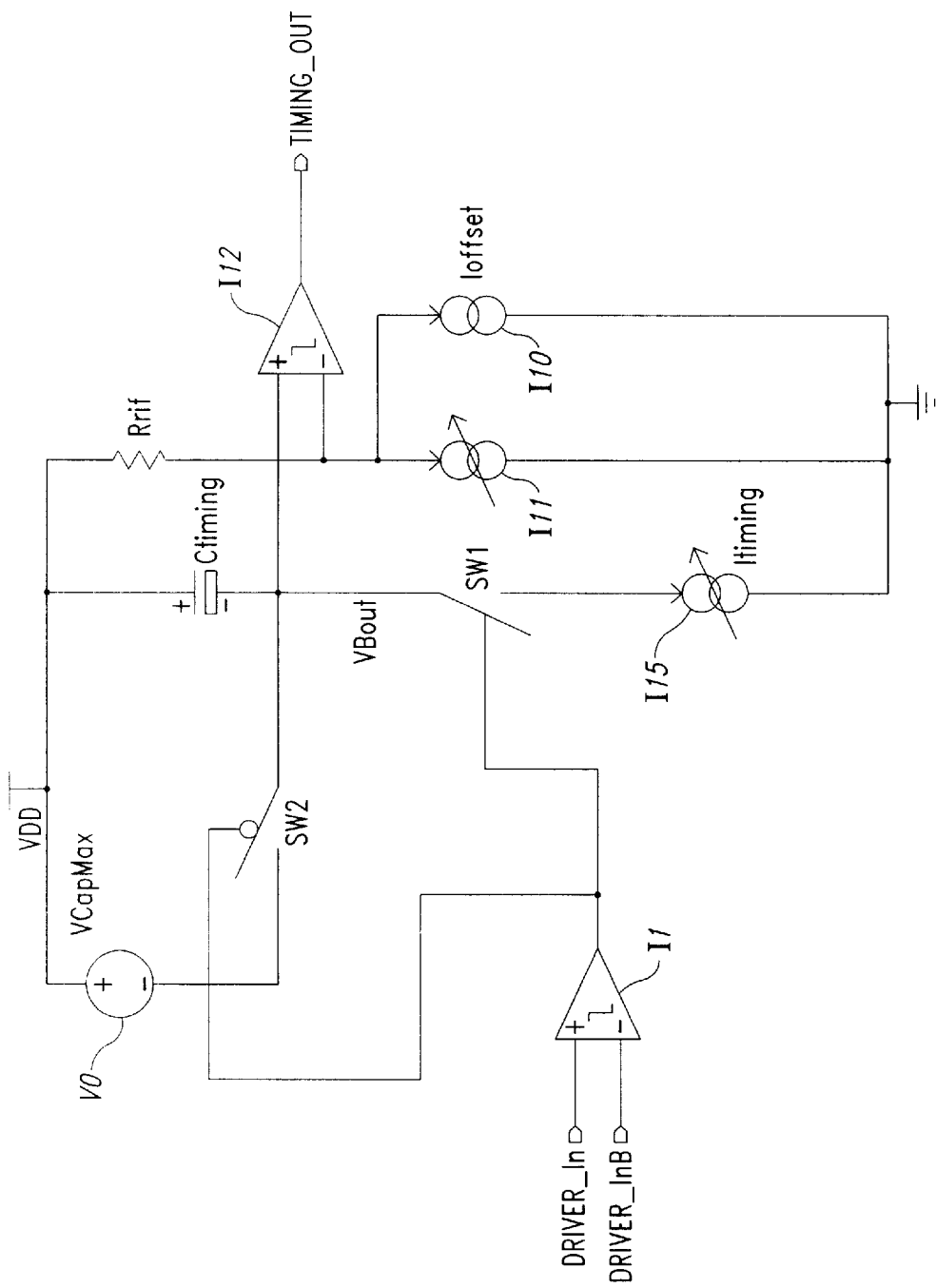
FIG. 1 provides an overview of a sample embodiment.

The numerous innovative teachings of the present application will be described with particular reference to the presently preferred embodiment (by way of example, and not of limitation), in which:

FIG. 1 provides an overview of a sample embodiment. In this embodiment the circuit includes a voltage comparator I12 which compares an integration voltage (i.e. the result of a first current generator generating an integrating current $I_{timing}$ on capacitor $C_{timing}$) with a reference voltage which is equal to the ohmic voltage drop across the resistor Rrif. The output of comparator I12 is connected to provide an output signal TIMING_OUT, which changes state when the integration voltage crosses the reference voltage.

Figure 2:
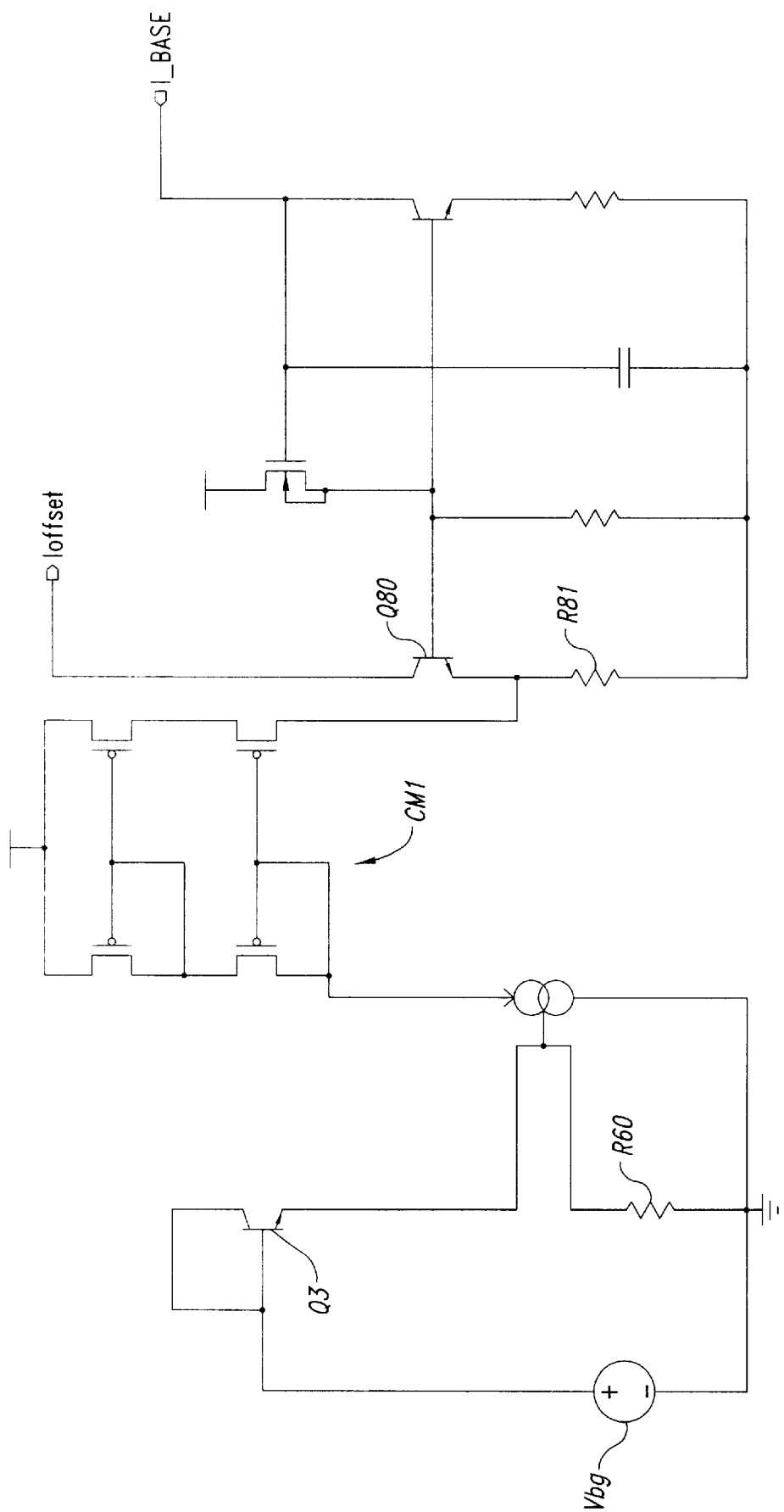
FIG. 2 shows a sample implementation of the circuit which generates a temperature-dependent Ioffset for the circuit of FIG. 1.

The current through resistor Rrif is a combination of two elements, namely:

a current Idac from a current-domain DAC I11, and a current Ioffset from the current generator I10, shown in detail in FIG. 2.

The timer is activated by an enable signal (DRIVER_In, which in this embodiment is accompanied by a complementary signal DRIVER_InB) from a processor or other logic.

When the enable signal is inactive, the output of comparator I1 disables switch SW1 and enables switch SW2, so the terminal VBout of the timing capacitor Ctiming is pulled to the voltage VCapMax from voltage source V0. The offset level of Rrif (determined by the current Ioffset as well as the resistance of Rrif) is selected to produce a voltage drop greater than that across the capacitor (VCapMax)—when the timing Itiming/Ctiming is not enabled. (Note that the voltages generated, in the presently preferred embodiment, are referred to $V_{DD}$, and the current generators in this example are current sinks.)

When the enable signal then goes active, the output of comparator I1 disables switch SW2 and enables switch SW1, so the terminal VBout of the timing capacitor Ctiming is ramped down until the comparator I12 changes state.

Thus transitions in the signal TIMING_OUT follow transitions in the input signal, with a certain reliable delay.

Thus the innovative circuit shifts the level of the threshold offset voltage by means of a current (Ioffset) from a current generator (I10) whose output value varies with temperature to provide the desired matching. This is necessary whenever a time delay variation occurs as temperature varies between the circuits that actuate the timer and the circuits that are driven from the timer.

FIG. 2 shows a sample implementation of the circuit which generates Ioffset in a temperature-dependent way. The offset current value is set by the current I_BASE, being the ratio of a bandgap voltage (not shown) on an internal resistor. This current is mirrored onto the BJT Q80 at a suitable ratio. Q80's emitter resistor (R81) also receives another current (from current mirror CM1) whose value is proportional to (Vbg-VbeQ3)/R60. (The ratio is of course dependent on the device dimensions in the current mirror.) The temperature coefficient of the last-mentioned current is positive, for the following reasons: Since Vbg is a bandgap voltage, and the coefficient of Vbe is negative and larger in magnitude than that of the base resistor (in the technology used for this implementation), Vbg-Vbe will be increased (as temperature rises) more than the corresponding increase in the value of R60, and therefore the ratio (Vbg-VbeQ3)/R60 will increase.

On the contrary, I_BASE decreases with rising temperature because the bandgap voltage reference is constant, and the base resistance increases.

Thus with rising temperature, the voltage across resistor R81 will increase due to the compensation current. Since the combination of $V_{R81}+V_{beQ80}$ is set by I_BASE, the net result is a decrease of $V_{beQ80}$ and a further decrease of Q80's collector current (Ioffset) from that caused by the decrease of I_BASE. Based on this variation law, the drop across Rrif can be reduced as temperature goes up, thereby compensating for the delays introduced by the various circuit blocks on which timing is dependent.

It is a particular advantage of this circuit that the ratio of the compensation current to I_BASE can be set to meet specific requirements by a suitable selection of the mirror ratio.

Figure 3:
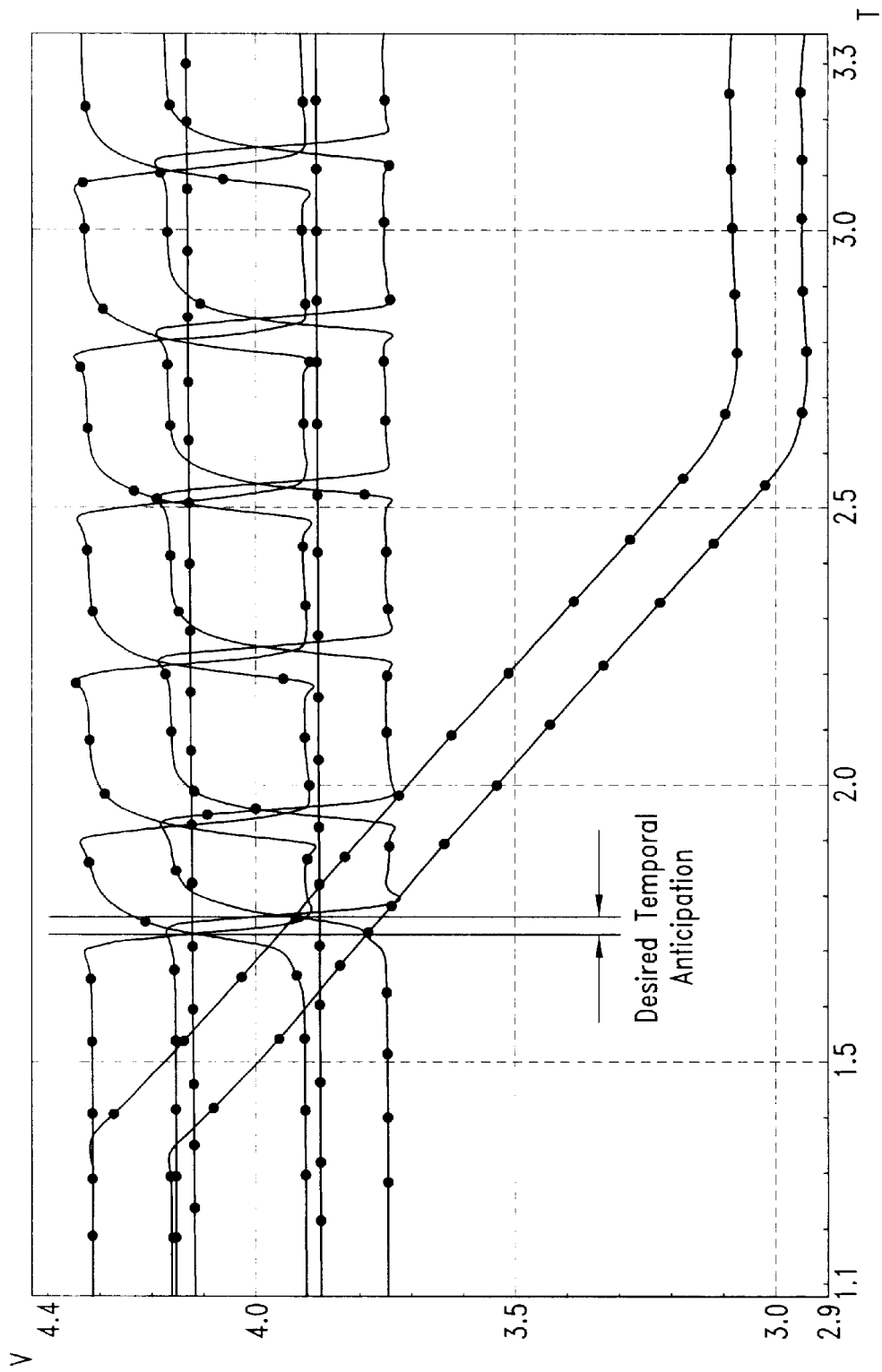
FIG. 3 shows waveforms resulting from the circuits of FIGS. 1 and 2.

FIG. 3 shows waveforms (at 27° C. and at 127° C.) which are produced by the circuit of FIGS. 1 and 2. In this example the comparator is driven by a Zero-Crossing Detector, and the output signal from the timer turns on an oscillator whose turn-on time increases with temperature, for a given enable signal. The proposed solution allows this delayed turning on to be compensated such that no errors are introduced in the timing chain.

The solution provided is advantageously low in consumption and circuit complexity.

Sample System Context

The innovative circuit can be used in many design contexts, and generally is useful for temperature compensation wherever an analog timer is used.

One very important and attractive class of applications is in read interface circuits for disk drive applications. In modern read interface circuits, particularly those using a PRML architecture, a temperature-compensated timing circuit helps to minimize bit error rate.

Figure 4A:
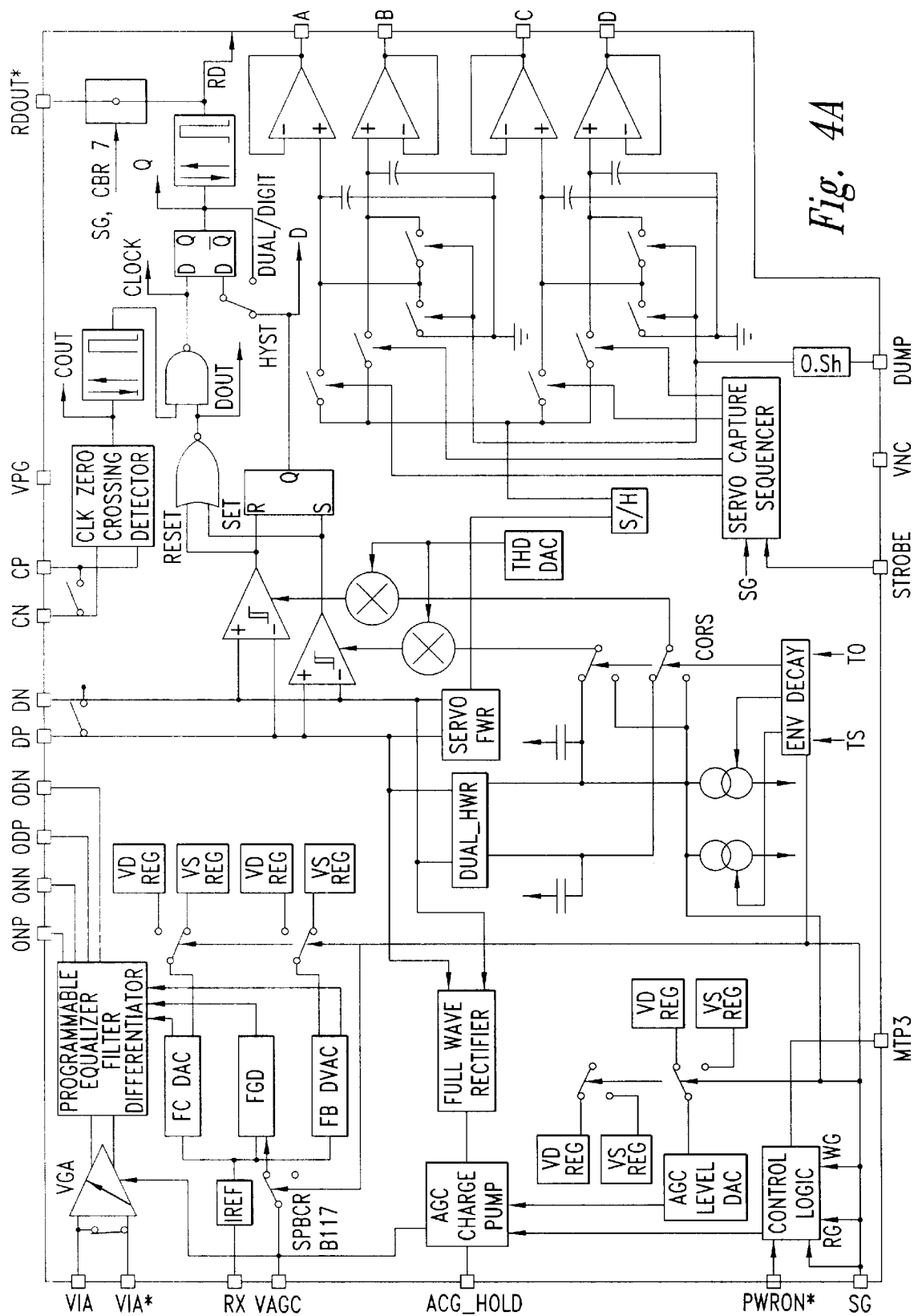
FIGS. 4A and 4B show a sample system context, where the circuit of FIG. 1 is incorporated in a read-interface circuit.
Figure 4B:
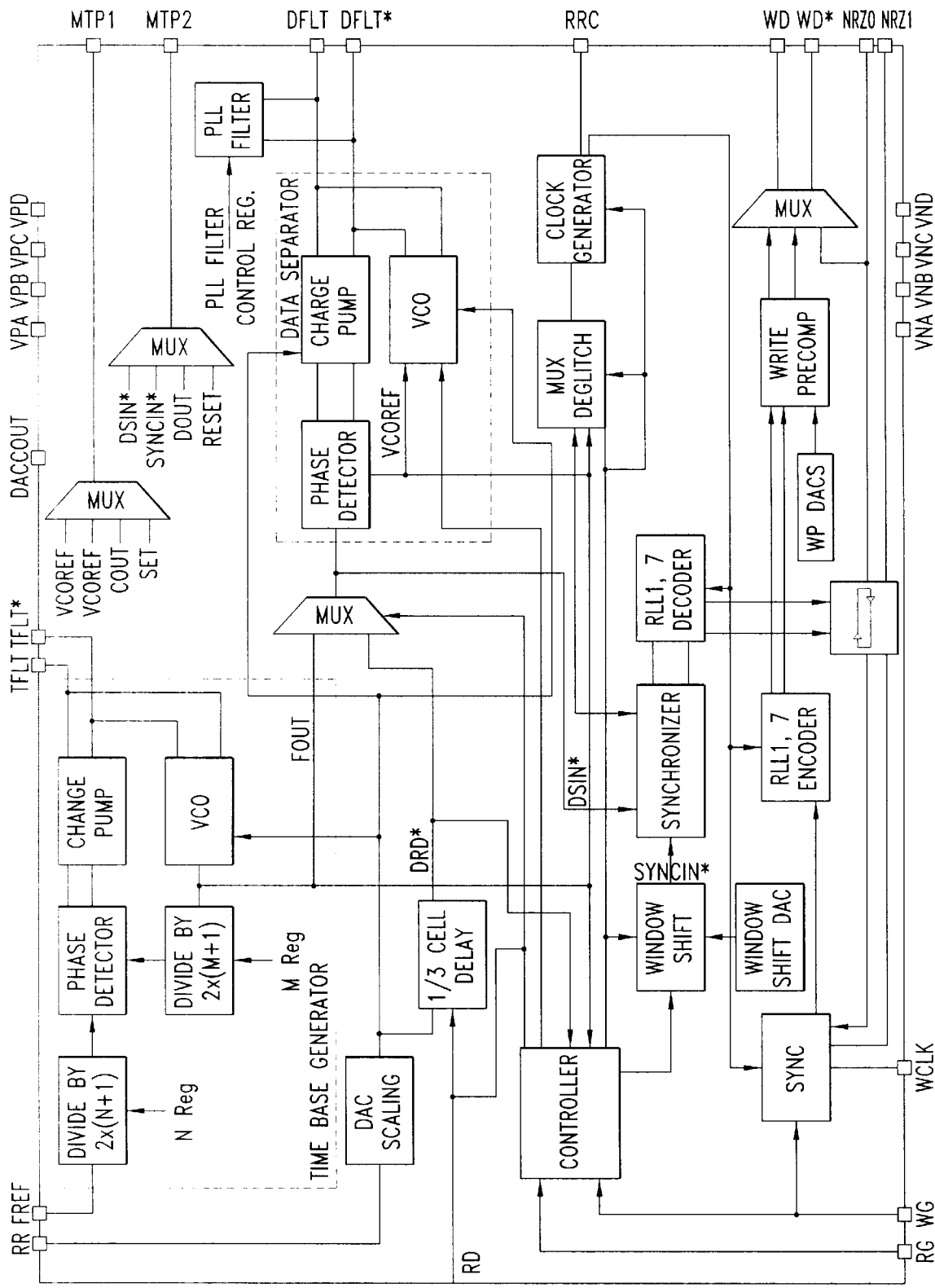

FIGS. 4A and 4B show a sample system context, where the circuit of FIG. 1 is incorporated in a read-interface circuit. In this sample embodiment, the circuit of FIG. 1 is used to implement a read/write channel IC. The specific sample chip embodiment will be referred to as an "L6037", but this does not imply that the innovative circuit has or will appear in every or any chip which may be sold under this part number.

The L6037 device is a high performance BICMOS single chip read/write channel IC that integrates all the analog read channel and servo demodulator functions required to implement a complete multiple zone recording hard disk drive system. The functional blocks included in L6037 are the AGC, programmable filter, pulse detector, 4 peak servo burst output, time base generator, and data separator with 1,7 RLL ENDEC. Data rates up to 90 Mbit/sec can be programmed by digital commands, without external component switching. With the large scale integration technology, only a minimal number of external components is required.

The L6037 allows complete flexibility in read channel configuration. Essentially all critical parameters can be programmed by a microprocessor via a bidirectional serial interface and a bank of 19 internal registers. Using the L6037, a low component count and low cost zoned recording system can be implemented easily.

The L6037 is fabricated in SGS-Thomson advanced 1.2 micron mixed signal analog/digital BICMOS process along with advanced circuit design methodology, which result in a high performance device with low power consumption. The device dissipates 650 mW typical at maximum data rate and 5V power supply.

Following is a brief summary of some notable features of this integrated circuit, in the presently preferred embodiment. These features are generally not necessary for implementation of the claimed inventions, but are included merely to provide a fuller overview of this sample embodiment.

In general, this sample implementation provides: a low-power fully integrated read/write channel device with up to 90 Mbit/s data rate operation, and: bidirectional serial interface for access to internal registers; complete zoned density recording application support; an integrated channel filter with selectable cutoff frequency, adjustable boost and group delay equalization; and a fully integrated time base generator with fine resolution frequency synthesizer.

Features of the Automatic Gain Control implementation, in the presently preferred embodiment, include: Temperature compensated, exponential control VGA (variable-gain amplifier); Fast Decay mode with programmable duration for rapid AGC acquisition; Dual rate charge pump for fast AGC transient recovery; Low drift AGC hold circuitry for embedded servo support; and Low-Z switch with programmable duration for rapid write to read recovery.

Features of the Programmable Filter implementation, in the presently preferred embodiment, include: No external filter components required; Filter input DC coupled to VGA output to avoid signal transient distortion; Programmable cutoff frequency of 8 to 30 MHz; Separate registers for filter cutoff frequency in Data mode and in Servo mode; Separate registers for programmable boost of 0 to 13 dB in Data and Servo modes; Programmable Group Delay Equalization that can be disabled in Servo mode; Matched normal and differentiated outputs, with ±10% $f_c$ accuracy, ±2% group delay variation, and less than 1% total harmonic distortion.

Features of the Pulse Detector implementation, in the presently preferred embodiment, include: Hysteresis or dual comparator qualification modes for Data; Separate envelope detector for positive and negative peaks; Programmable pulse qualification threshold with selectable references as detected envelope or fixed voltage; Programmable envelope detector decay time constants for servo and data; Internal Low-Z timing for rapid transient recovery; Separate registers for pulse qualification threshold in Data mode and in Servo mode (7 bits); 0.6 ns max. pulse pairing with sine wave input.

Features of the Servo Capture implementation, in the presently preferred embodiment, include: 4-burst peak servo outputs; one bit programmable charge time constant for peak detection; separate registers for filter cutoff frequency in data mode and in servo mode; and separate registers for pulse qualification threshold in data mode and in servo mode.

Features of the Time Base Generator implementation, in the presently preferred embodiment, include: better than 1% frequency synthesizer resolution; up to 135 MHz frequency output; separate M and N register dividers in reference path and VCO path for fine frequency resolution; and VCO center frequency matched to data separator VCO center frequency. However, the performance of the Time Base Generator can be further improved by using the innovative circuit of FIG. 1, as described above.

Another feature of this sample embodiment is: a fully integrated data separator with integrated data delay (no external components required), and programmable decode window symmetry, with window shift control and delayed read data and VCO reference monitor points.

Another feature of this sample embodiment is: a fast acquisition phase lock loop with wide capture range, zero phase restart technique, programmable Kd for data lock acquisition and data tracking in read mode, and a dual mode phase detector (phase/frequency or phase only).

Other features of this sample embodiment include: an integrated 1,7 RLL Encoder/Decoder; and programmable write precompensation.

The time base generator of FIGS. 4A and 4B can advantageously be implemented using the innovative circuit of FIG. 1. The time base generator, which is a PLL based circuit, provides a programmable frequency reference (FOUT) to support constant density recording applications. The frequency can be programmed with a resolution better than 1%. An external passive loop filter is required to control the PLL looking characteristics. The filter is fully differential and balanced in order to suppress common mode noise generated, for example, from the data synchronizer's PLL.

In read, write and idle modes, the time base generator is programmed to provide a stable reference frequency for the data synchronizer. In read mode the internal reference clock is disabled after the data synchronizer has achieved lock and switched over to read data as the source for the RRC. This minimizes jitter in the data synchronizer PLL. The reference frequency is programmed using the M and N registers of the time base generator vai the serial port, and is related to the external reference clock input FREF as follows:
FOUT=((M+1)/(N+1)) FREF.
Note, however, that both FREF & TBG VCO outputs are divided by 2 before going into the (N+1) & (M+1) dividers, so the update rate of the phase detector is FREF/(2·(N+1)). The VCO center frequency and the phase detector gain of the time base generator are controlled by an external resistor connected from RR pin to VNA. An internal DAC (DACI) addressed through the data recovery control register (DRCR) generates a multiple of the current set by RR to program the free running frequency of the VCO. Bit 7 of DRCR indicates the polarity of the ΔV across the TBG filter pins (TFLT-TFLT*) which can be used to adjust the DAC value to obtain low differential voltage at the filter pins (i.e., If this bit is "1" (V=positive) than current is low and DAC value need to be increased). The timebase generator VCO will begin a frequency acquisition only after the DRCR register has been programmed. Writing to M and N registers will only preload the counters.

Data Separator Circuit

The data separator circuit provides complete encoding, decoding, and synchronization for RLL 1, 7 format data. In the read mode, the circuit performs sync field search and detect data synchronization, and data decoding. In the write mode, the circuit provides data encoding, and write precompensation for NRZ data applied to the NRZO, NRZ1 pins. Data rate is established by the time base generator and the internal reference DACI controlled by the DR register. The DAC generates a reference current which sets the VCO center frequency, the phase detector gain, and the 1/3 cell delay.

Phase Locked Loop

The circuit employs a dual mode phase detector; harmonic in the read mode and non-harmonic in the write and idle modes. In the read mode the harmonic phase detector updates the PLL with each occurrence of a DRD* pulse. In the write and idle modes, the non-harmonic phase detector is continuously enabled, thus maintaining both phase and frequency lock onto the reference frequency of the internal time base generator. By acquiring both phase and frequency lock to the input reference frequency and utilizing a zero phase restart technique, the VCo transient is minimized and false lock to DLYD DATA is eliminated. The phase detector incorporates a charge pump in order to drive the loop filter directly. The polarity and width of the output current pulses correspond to the direction and magnitude of the phase error.

The data synchronizer also requires an external passive loop filter to control its PLL locking characteristics. The filter is again fully differential and balanced in order to suppress common mode noise which may be generated from the time base generator's PLL.

Mode Control

The read gate (RG) and write gate (WG) inputs control the device operating mode. RG is an asynchronous input that should be initiated during the 3T preamble. WG is also an asynchronous input, but should not be terminated prior the last output write data pulse.

Read Mode

The data synchronizer utilizes a fully integrated fast acquisition PLL to accurately develop the decode window. Read gate (RG) initiates the PLL locking sequence and selects the PLL reference input; a high level RG (read mode) selects the internal delayed read data (DRD*) input and a low level selects the reference clock (FOUT). In read mode, each falling edge of DRD* enables the phase detector while the rising edge is phase compared to the rising edge of the VCO reference (VCOREF). DRD* is a 1/3 cell wide (TVCO/2) pulse whose leading edge is defined by the falling edge of the internal RD. A decode window is developed from the VCO clock.

VCO Lock and Bit Sync Enable

When RG goes high, a counter counts the first 2 transitions of the DRD*. Following the second pulse, the VCO is held and restarted synchronous with the rising edge of the fourth DRD*. Following this zero phase restart, one of two VCO locking modes will be entered depending on the state of the Acquisition gain shift (AGS) bit, or Bit 2, in the Control B register. If AGS-"1", the phase detector will enter a gain shift mode of operation. The phase detector goes into a high gain mode (KD×3) after the 3rd 3T, to support fast phase acquisition. High gain is maintained for 12 DRD* transitions after the zero phase restart. After the 16th pulse the gain is reduced by a factor of 3 (KD×1). This reduces the bandwidth and damping factor of the loop by √3 which provides improved jitter performance in the data follow mode. The counter continues to count the next 3 DRD* transitions (a total of 19×3T from assertion of RG) and then asserts an internal VCO lock signal. Further control of KD in data follow mode (After 17×3T from RG) can be obtained by Data follow gain switch (DFGS) bit, or Bit 6 of CBR. If DFGS="0", then KD stays 1×, and if DFGS="I" then KD is reduced to 0.5× for the rest of the read cycle and switched back to 1× at the zero phase restart of VCO, locking back to TBG output after RG goes low.

The VCO lock signal activates the decoder bit synchronization circuitry to define the proper decode boundaries. The next 3×3T patterns are used to set the proper decode window to that VCO is in sync with RRC and RRC is in sync with the data. Following this, the nRZ output is enabled and the data is toggled through the decoder for the duration of the RG.

When the VCO lock signal is asserted, the internal RRC source is also switched from the time base generator to the VCO clock signal that is phase locked to DRD*. During the internal RRC switching period the external RRC signal may be held for a maximum of 1 NRZ clock period, however no short duration glitches will occur.

When the AGS bit is set to "0" the phase detector gain shift function during acquisition is disabled. The VCO lock sequence is identical to that of the gain shift mode explained above, except that the gain remains 1× during acquisition and can be reduced to 0.5× in data follow mode if DFGS bit is set to "1".

As an option the chip provides an internal loop filter that can be optimized for each zone by programming pII register. Internal filter is composed of a capacitor in series with a resistor connected in between DFLT-DFLT* pins. This components may be removed by setting the register to $00_H$ if external filter is selected.

According to a disclosed class of innovative embodiments, there is provided: An integrated timer circuit, comprising: a timing current generator connected to provide a current onto an integration capacitor; and a comparator connected to compare a voltage of the integration capacitor against a reference voltage, to accordingly produce a timing output signal; wherein the reference voltage is provided to the comparator from a load impedance which is driven not only by an output of a programmable current generator, but also by a supplemental current generator whose output is more temperature-dependent than the output of the programmable current generator.

According to another disclosed class of innovative embodiments, there is provided: An integrated timer circuit, comprising: a timing current generator connected to provide a timing current onto an integration capacitor; a comparator connected to compare a voltage of the integration capacitor against a voltage taken from a load impedance, to produce a timing output signal; a digitally programmable current generator connected to drive the load impedance with a first current contribution; and a supplemental current generator connected to drive the load impedance with a second current contribution.

According to another disclosed class of innovative embodiments, there is provided: An integrated circuit timing method, comprising the steps of: connecting a current generator to an integration capacitor, to ramp the voltage on the integration capacitor; generating a reference voltage on a load impedance, by applying a current to the load impedance which comprises a first current contribution from a programmable current generator, and a second current contribution from a supplemental current which has a much larger temperature dependence than the programmable current generator; and comparing the voltage on the integration capacitor against the reference voltage to produce a timing output signal.

In one class of embodiments, said timing current and said integration capacitor and said reference voltage are proportioned to cause said comparator to switch within 3 to 30 nanoseconds after said timing current begins to ramp up said integration capacitor.

Modifications and Variations

As will be recognized by those skilled in the art, the innovative concepts described in the present application can be modified and varied over a tremendous range of applications, and accordingly the scope of patented subject matter is not limited by any of the specific exemplary teachings given.

For example, as will be obvious to those of ordinary skill in the art, other circuit elements can be added to, or substituted into, the specific circuit topologies shown.

For another example, within the constraints well-known to those of ordinary skill, a variety of well-known current mirror configurations can be substituted for those shown.

For another example, within the constraints well-known to those of ordinary skill, a variety of well-known amplifier and buffer configurations can be substituted for those shown.

For another example, within the constraints well-known to those of ordinary skill, the load impedance on which the reference voltage is generated does not have to be a perfectly linear resistor.

Some background on analog circuit implementation generally can be found in the following books, all of which are hereby incorporated by reference: the ANALOG CIRCUIT DESIGN SEMINAR books published by Analog Devices; ANALOG CIRCUIT DESIGN (ed. J.Williams 1991); Analog Dialogue from 1980 to date; Collins, ANALOG ELECTRONICS HANDBOOK (1989); Coughlin and Driscoll, OP AMPS AND LINEAR INTEGRATED CIRCUITS 3.ed. (1991); Davidse, INTEGRATION OF ANALOGUE ELECTRONIC CIRCUITS; Feucht, HANDBOOK OF ANALOG CIRCUIT DESIGN (1990); Geiger et al., VLSI DESIGN TECHNIQUES FOR ANALOG AND DIGITAL CIRCUITS; Gray & Meyer, ANALYSIS & DESIGN OF ANALOG INTEGRATED CIRCUITS (2.ed. 1983 and 3.ed. 1993); Grebene, BIPOLAR & MOS ANALOG IC DESIGN (1984); Haskard and May, ANALOG VLSI DESIGN (1987); L. P. Huelsman, and P. E. Allen, INTRODUCTION TO THE THEORY AND DESIGN OF ACTIVE FILTERS (1980); Moschytz, LINEAR INTEGRATED NETWORKS: DESIGN (1975); Moschytz, LINEAR INTEGRATED NETWORKS: FUNDAMENTALS (1974); Pease, TROUBLESHOOTING ANALOG CIRCUITS; Schaumann et al., DESIGN OF ANALOG FILTERS (1990); J.Scott, ANALOG ELECTRONIC DESIGN (1991); Soclof, DESIGN AND APPLICATIONS OF ANALOG INTEGRATED CIRCUITS; Toumazou et al., ANALOGUE IC DESIGN: THE CURRENT-MODE APPROACH.

Another attractive class of applications for the innovative timing circuit is for clock recovery circuits in telecomm applications.

What is claimed is:

1. A computer disk drive, comprising:
   a rotatable storage media to store data representing a plurality of data patterns;
   a motor to rotate the storage media;
   a read head positioned proximate the storage media to detect the plurality of data patterns therefrom; and
   a read circuit coupled to the read head to generate data based on the detected data patterns, the read circuitry including a clock circuit to produce a timing signal for data timing recovery; the clock circuit comprising:
   a timing capacitor;
   a first current generator to generate a first current at a current output, said current output coupled to said timing capacitor;

a programmable current generator to generate a programmable current at an output of said programmable current generator;

a supplemental current generator whose output is more temperature-dependent than said output of said programmable current generator;

a load impedance driven by said output of said programmable current generator and by output of said supplemental current generator to generate a reference voltage; and a comparator connected to compare a voltage of said timing capacitor against said reference voltage, to accordingly produce a timing output signal.

2. The disk drive of claim 1 wherein the clock circuit is a portion of a partial-response maximum-likelihood detection circuit.

3. The disk drive of claim 1 wherein said load impedance comprises a resistor.

4. The disk drive of claim 1 wherein said programmable current generator is a digitally programmable current generator.

5. The disk drive of claim 1, wherein said supplemental current generator includes a bipolar transistor connected to receive a temperature-dependent base current, and having a first current-carrying terminal connected to a temperature-dependent base voltage, ana having a second current-carrying terminal connected to provide said supplemental current at said output of said supplemental current generator.

6. The disk drive of claim 1, wherein said supplemental current generator includes a bipolar transistor connected to receive a temperature-dependent base current, and having an emitter connected to an emitter resistor which is driven with a temperature-dependent current, and having a collector connected to provide said supplemental current at said output of said supplemental current generator.

7. The disk drive of claim 1 wherein a current value of said programmable current and a capacitance value of said timing capacitor and said reference voltage are proportioned to cause said comparator to switch within 3 to 30 nanoseconds after said timing current begins to ramp up said timing capacitor.

8. The disk drive of claim 1 wherein said first current generator, said programmable current generator, said supplemental current generator and said comparator are integrated onto a single integrated circuit substrate.

9. A disk drive method of operation, comprising:

rotating a storage media containing data representing a plurality of data patterns;

positioning a read head in proximity with the rotating storage media;

using a clock signal to detect the plurality of data patterns from the rotating storage media; and generating the clock signal by:

connecting a current generator to an integration capacitor;

generating a first current;

generating a second current whose current value has a much larger temperature dependence than the first current;

generating a reference voltage on a load impedance by applying a reference current to the load impedance, the reference comprising said first and second currents; and comparing the voltage on the integration capacitor against the reference voltage to produce the clock signal.

10. The method of claim 9 wherein generating the clock signal utilizes a partial-response maximum-likelihood detection circuit.

11. The method of claim 9 wherein generating a reference voltage on the load impedance uses a resistor.

12. The method of claim 9 wherein generating the second current uses a bipolar transistor connected to receive a temperature-dependent base current, and having a first current-carrying terminal connected to a temperature-dependent voltage, and having a second current-carrying terminal connected to generate the second current.

13. The method of claim 9 wherein generating the second current uses a bipolar transistor connected to receive a temperature-dependent base current, and having an emitter connected to an emitter resistor which is driven with a temperature-dependent current, and having a collector connected to generate the second current.

14. The method of claim 9 wherein comparing and producing the clock signal includes switching the clock signal from a first level to a second level and wherein a current value of the reference current and a capacitance value of the integration capacitor and the reference voltage are proportioned to cause the clock signal to switch within 3 to 30 nanoseconds after the current generator begins to control the voltage on the integration capacitor.

* * * * *

UNITED STATES PATENT AND TRADEMARK OFFICE
CERTIFICATE OF CORRECTION

PATENT NO.   : 6,147,825
DATED        : November 14, 2000
INVENTOR(S)  : Roberto Alini et al.

It is certified that error appears in the above-identified patent and that said Letters Patent is hereby corrected as shown below:

<u>Title page,</u>
Item [75], the second inventor's data should read
-- Melchiorre Bruccoleri, Genova; --.

<u>Column 9,</u>
Line 9, "and by output" should read as -- and by said output --.
Lines 28 and 29, "temperature-dependent base voltage, ana having" should read as -- temperature-dependent voltage, and having --.

<u>Column 10,</u>
Line 18, "the reference comprising" should read as -- the reference current comprising --.

Signed and Sealed this

Eighteenth Day of June, 2002

*Attest:*

*Attesting Officer*

JAMES E. ROGAN
*Director of the United States Patent and Trademark Office*